United States Patent [19]

Sisler

[11] Patent Number: 4,501,460
[45] Date of Patent: Feb. 26, 1985

[54] MODULAR HOUSING FOR COMPUTER SYSTEM

[75] Inventor: John R. Sisler, Sunnyvale, Calif.

[73] Assignee: Convergent Technologies, Inc., Santa Clara, Calif.

[21] Appl. No.: 493,089

[22] Filed: May 9, 1983

[51] Int. Cl.³ .............................................. H01R 13/62
[52] U.S. Cl. .............................. 339/49 R; 339/75 M; 339/91 R
[58] Field of Search .............. 339/47 R, 49 R, 75 R, 339/75 M, 91 R

[56] References Cited

U.S. PATENT DOCUMENTS

| | | | |
|---|---|---|---|
| 3,425,025 | 1/1969 | Williams | 339/75 M |
| 3,453,586 | 7/1969 | Brendlen, Jr. | 339/75 M |
| 3,836,885 | 9/1974 | Larsile | 339/75 R |
| 4,344,663 | 8/1982 | Ognier et al. | 339/91 R |
| 4,367,003 | 1/1983 | Frantz | 339/91 R |

FOREIGN PATENT DOCUMENTS 2037504 7/1980 United Kingdom .......... 339/75 M

Primary Examiner—John McQuade
Attorney, Agent, or Firm—Townsend and Townsend

[57] ABSTRACT

An improved housing (15, 17) and associated latching mechanism that render practicable the implementation of a completely modular computer system. The latching mechanism effects simple positive engagement and disengagement of the pin and socket connectors (22, 20) as respective outer surfaces of a first wall (25) on a first module housing (15) and a second wall (27) on a second module housing (17) are brought together or separated. The second wall (27) carries a plurality of hooking members (30) which pass through corresponding apertures (32) in the first wall (25) and are captured and restrained by a reciprocable latch bar (50) inside the first housing (15). A rotary latch (37) engages the latch bar (50) such that actuation of a handle (40) on the rotary latch (37) causes reciprocation of the latch bar (50) between a first accommodating position and a second capturing position. The hooking members (30) have respective camming surfaces (48) in spaced facing relationship to the external surface of the second wall (27) while the latch bar (50) is formed with complementarily configured camming surfaces (53) spaced and located so as to engage the camming surfaces (48) on the hooking members (30) when the latch bar (50) moves towards its capturing position. The hooking members (30) are distributed over the surface so that the modules (10, 12) are drawn together in a direction that minimizes sideways forces on the pins in the connector (22).

26 Claims, 3 Drawing Figures

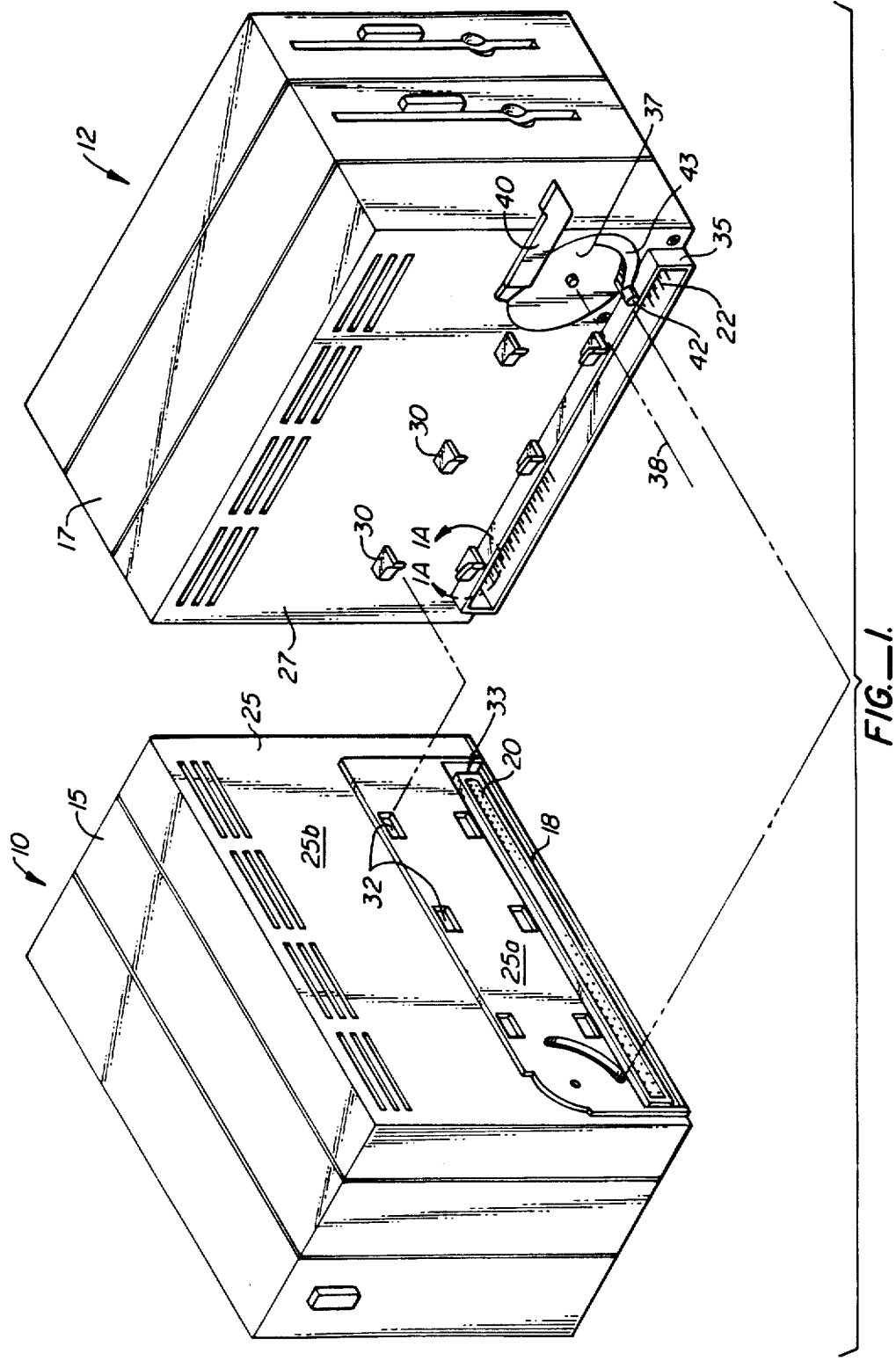

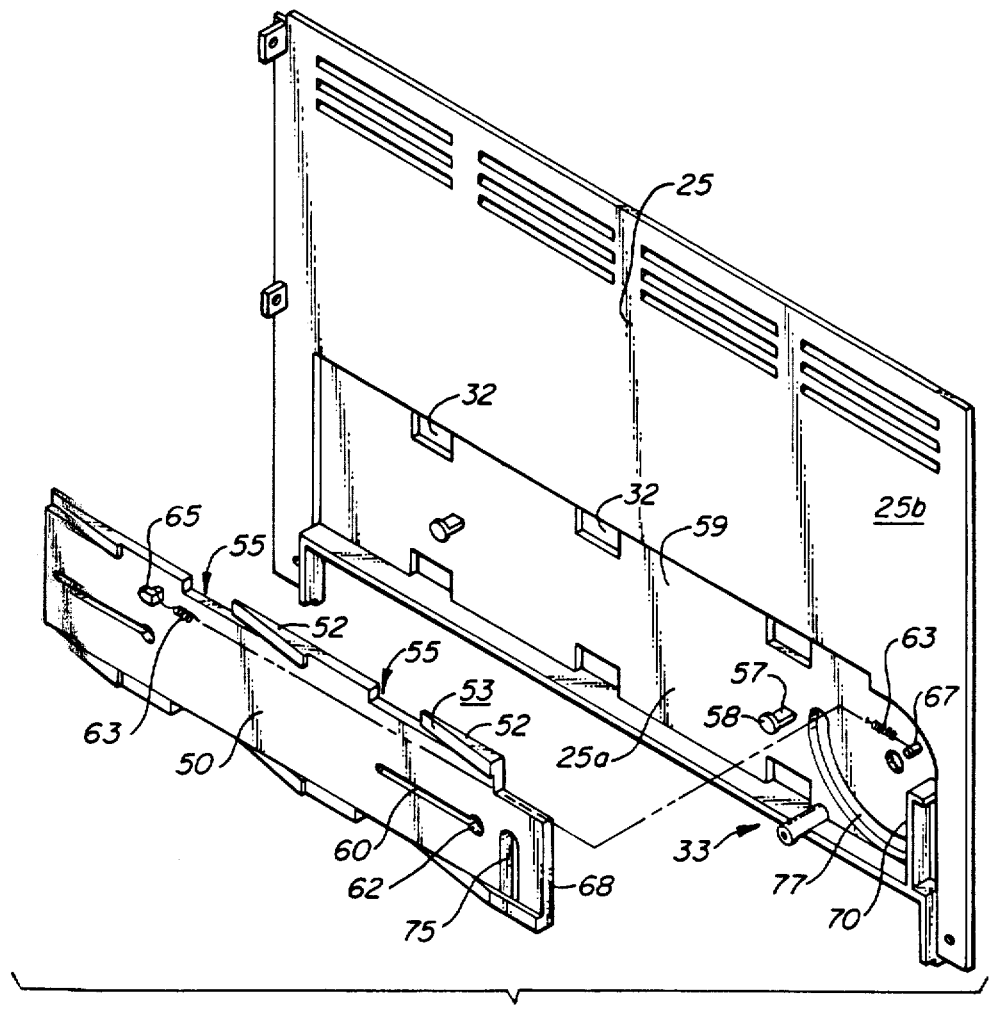
FIG._2.
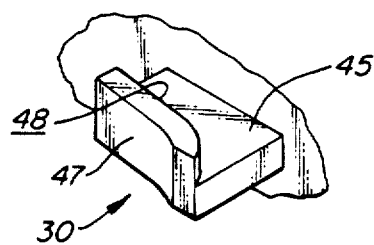
FIG._1A.

MODULAR HOUSING FOR COMPUTER SYSTEM

FIELD OF THE INVENTION

The present invention relates generally to housings, and more specifically to a modular housing and associated latching mechanism for use in a multi-module computer system.

BACKGROUND OF THE INVENTION

Most computer systems are structured with multiple functional units coupled in parallel to a common bus. For many applications, the bus medium comprises printed circuit board traces on a so-called backplane or motherboard with a plurality of socket connectors extending transversely with respect to the bus traces. The functional units are built on circuit boards having edge connectors or contact areas which plug into the socket connectors. The circuit boards are thus held in spaced parallel relation, with the entire assembly enclosed within a housing. For example, a motherboard might have eight such connectors within the housing, thereby allowing the system to be configured with up to eight functional units. Expansion beyond eight functional units would require an additional enclosure with some means of interconnection, such as jumper cables.

A different approach uses a separate housing for each functional unit. Within the housing is a motherboard segment having a complementary pin and socket connector portions along opposite edges, in addition to the intermediately positioned board-receiving socket connector. An overall system is assembled by engaging the socket connector portions on one unit with the pin connector portions on another unit, as many times as necessary to connect all the units.

This approach is truly modular because it permits a system to be configured by adding modules as required, with the resultant longitudinal dimension being no greater than that dictated by the desired number of modules. Moreover, the modules themselves are physically relatively small.

However, the increased number of physical housings increases the problems associated with connecting the modules because the pin and socket connectors require precise registration to avoid damage to the pins. Even where appropriate registration means can be provided, considerable force is required to engage or disengage the connectors. A failure to properly engage the connectors could cause unreliable operation which could be catastrophic in a data processing environment.

Accordingly, despite the desirability of total modularity, the connection problems described above have stood as a major impediment to the full exploitation of the promising potential such modularity offers.

SUMMARY OF THE INVENTION

The present invention provides an improved housing and associated latching mechanism that render practicable the implementation of a completely modular computer system. The latching mechanism effects simple positive engagement and disengagement of the pin and socket connectors as respective outer surfaces of a first wall on a first module housing and a second wall on a second module housing are brought together or separated.

Broadly, the second wall carries a plurality of hooking members which pass through corresponding apertures in the first wall and are captured and restrained by a reciprocable latch bar inside the first housing. A rotary latch engages the latch bar such that actuation of a handle on the rotary latch causes reciprocation of the latch bar between a first accommodating position and a second capturing position. The hooking members have respective camming surfaces in spaced facing relationship to the external surface of the second wall while the latch bar is formed with complementarily configured camming surfaces spaced and located so as to engage the camming surfaces on the hooking members when the latch bar moves towards its capturing position. The hooking members are distributed over the surface so that the modules are drawn together in a direction that minimizes sideways forces on the pins in the connector.

According to a further aspect of the present invention, the rotary latch is formed with a helical camming surface that forces the first and second walls apart as the rotary latch is rotated for disengagement. Such a positive force is required to disengage the first and second cooperating connector portions. Thus the rotary latch provides positive disengagement in the same manner that the latch bar provides positive engagement.

For a further understanding of the nature and advantages of the present invention, reference should be made to the remaining portion of the specification and to the attached drawings.

BRIEF DESCRIPTION OF THE DRAWINGS

FIG. 1 is an isometric view showing two disengaged modules;

FIG. 1A is a close-up view of a hooking element; and

FIG. 2 is an exploded isometric view showing the interior of the first module wall.

DESCRIPTION OF THE PREFERRED EMBODIMENTS

FIG. 1 is an isometric view showing first and second modules 10 and 12 which may, for example, be a processor unit and a dual floppy disk unit for a modular computer system. Modules 10 and 12 include electronic components within respective housings 15 and 17. Each housing typically cormprises an injection molded plastic shell which is fastened to a metal chassis. The electronic components for each of the modules are mounted on a normally vertical circuit board (not shown) which plugs into a connector (not shown) mounted on a normally horizontal motherboard or backplane 18, an edge portion of which appears in the figure.

A given motherboard carries complementary connector portions along its opposite edges so that the motherboards may be serially connected. Thus, the first module has a first connector portion 20 which includes a plurality of sockets, and the second module has a second connector portion 22 which includes a corresponding plurality of pins engagable with the sockets. It will be appreciated that when multiple modules are connected together, the serially connected motherboards define a backplane data bus. The connectors may be those sold by AMP, Inc., as "MODU" right angle connectors. In the illustrative embodiment, the connectors have two rows of 60 pins (and corresponding sockets).

The present invention relates primarily to the mechanical latching mechanism that effects engagement and disengagement of the cooperating pin and socket connector portions. Housings 15 and 17 have facing first and second walls 25 and 27. Wall 25 is of stepped construction, as defined by spaced parallel wall portions 25a and 25b. For engagement, the external surface of wall portion 25a of first wall 25 of module 10 is brought into and maintained in contact with the external surface of second wall 27 of module 12. In the preferred embodiment, second module 12 has an opposite wall, not shown, which matches the configuration of first wall 25 on first module 10. This allows an additional module to be attached to module 12 in the same manner that module 12 is attached to module 10. Module 10, being a processor module, typically is not configured for the addition of another module on the wall not shown in the figure.

Broadly, a plurality of hooking members 30 are mounted on wall 27 and pass through a corresponding plurality of apertures 32 in wall portion 25a a first wall 25, to be captured by a sliding latch bar (to be described below). Connector portion 20 is disposed within an elongate opening 33 which extends along the lower edge of wall portion 25a. Wall 27 carries an elongate shroud 35 surrounding connector portion 22 and sized to pass into opening 33. The apertures (and hooking members) are preferably disposed in two horizontal rows, a first row located as close as is practicable to the connector portion, and a second row spaced thereabove.

Wall 27 also carries a rotary latch 37 mounted for rotation about an axis 38 perpendicular to wall 27. Latch 37 has a generally tangentially extending handle 40, an eccentric pin 42 parallel to axis 38, and a helical wedge 43 adjacent pin 42. As will be described below, pin 42 engages a portion of the sliding latch bar within first module 10 to convert rotary motion of the rotary latch to reciprocal motion of the latch bar.

Each hooking member 30 includes a spacer portion 45 extending perpendicularly from wall 27 and a flared inclined portion 47 having a camming surface 48 spaced from and facing the external surface of wall 27. In the preferred embodiment, the angle of inclination between camming surface 48 and wall 27 is 8.5 degrees.

FIG. 2 is an exploded isometric view of the interior of wall 25. Wall 25 carries a latch bar 50 mounted for reciprocation along the direction of opening 33. Latch bar 50 is an elongate plate-like member which carries a plurality of wedge-like camming portions 52 along its opposite edges. Camming portions 52 are spaced in a manner corresponding to the spacing of apertures 32 in wall 25, and each has a camming surface 53 configured complementarily with respect to camming surfaces 48 on hooking members 30. Latch bar 50 is formed so as to be devoid of material in the regions near the apices of the wedges, as for example by having notches 55.

The range of reciprocation of latch bar 50 includes a first position, designated the accommodating position, wherein notches 55 are aligned with apertures 32, and a second position, designated the capturing position, wherein camming portions 52 overlie at least portions of openings 32. With the latch bar in its first position, hooking members 30 freely pass through openings 32 and notches 55; as the latch bar moves toward its second position, camming surfaces 53 engage camming surfaces 48 of the hooking members 30 to draw the exterior surface of wall 27 into contact with that of wall portion 25a.

The stepped construction of wall 25 defines a recess 59 within which latch bar 50 reciprocates. The offset of wall portions 25a and 25b also defines a 4-millimeter spacing between wall portion 25b and wall 27 which provides clearance for rotary latch handle 40, clearance for ventilation, and a particular desired appearance. Latch bar 50 may be mounted to wall portion 25a by any convenient carriage means. In the preferred embodiment, wall portion 25a carries a pair of pins, each of which includes an upstanding tab 57 and a flanged head 58. Latch bar 50 is formed with slots 60 sized to accommodate tab 57 but not head 58, and apertures 62 contiguous with slots 60 to allow passage of heads 58 therethrough.

A tension spring 63 is connected between a pin 65 on latch bar 50 and a pin 67 on the inner surface of wall portion 25a in order to bias latch bar 50 towards its first position. An end portion 68 of latch bar 50 engages a stop 70 carried on wall 25 to define the first position.

Latch bar 50 is formed with a slot 75 extending perpendicularly with respect to the direction of reciprocation and sized to accommodate pin 42 on rotary latch 37. Wall portion 25a is formed with an arcuate slot 77 sized to clear pin 42 over approximately 100° of travel. Accordingly, when rotary latch 17 is oriented so that handle 40 is generally horizontal and pin 42 is near its lowermost position, and the external surfaces of wall portion 25a and wall 27 are brought toward one another with latch bar 50 in its first position, pin 42 on rotary latch 37 engages slot 75 in latch bar 50. Downward movement of handle 40 causes latch bar 50 to move toward its second capturing position with the wedge-like camming portions forcing the external wall surfaces together. Pin 42 is preferably of smaller diameter than the width of slot 75 (e.g. 5 mm as opposed to 6 mm) so that some free motion or rotary latch 37 is provided prior to disengagement. In this manner, the handle can be drawn outwardly from the side of the modules more easily.

It will be appreciated that pin 42 is at the extreme of its horizontal travel when latch bar 50 is in its second position. This provides, in effect, a positive lock. If desired, the rotary travel could be made so that pin 42 retrogresses slightly to provide a toggling or over-center effect.

While the engagement of the camming portions on the latch bar with those on the hooking members during reciprocation of the latch bar towards its second position positively pulls the electrical connector portion together, the reverse movement of the latch bar, in and of itself, has no disengaging effect. However, helical wedge 43 on rotary latch 35 bears against the exterior surface of wall portion 25a as handle 40 is moved upwardly toward its horizontal position, thereby effecting separation of the connectors. Wedge 43 does not interfere with engagement since the wedge enters arcuate slot 77 when the walls approach one another.

In summary, it can be seen that the present invention provides an improved latching mechanism which facilitates the interconnection of modules. The latching mechanism is also easily manipulated to separate modules when desired. By solving the persistent problems associated with the multi-pin connectors, the invention paves the way toward implementing a totally modular computer system.

While the above provides a full and complete description of the present invention, various alternate constructions, modifications, and equivalents may be employed without departing from the true spirit and scope of the invention.

For example, the rotary latch is shown as being carried on the second wall, that is, on the wall having the hooking members. This has an aesthetic advantage in that the exposed wall of the existing module (the first module prior to addition of the second module) has no visible moving protruding parts. However, the rotary latch could also be carried on the same wall as the latch bar.

Additionally, the camming surfaces need not be flat, and while an 8.5-degree ramp angle is shown, other angles are suitable. The particular angle depends on the desired amount of leverage. Once an angle is determined, the length of latch bar travel is then determined by the required amount of draw. For example, in the preferred embodiment, the connectors utilize a 4-millimeter draw, and the preferred embodiment provides a 5-millimeter draw to ensure that the connectors are fully engaged.

Moreover, while two rows of hooking members and apertures are disclosed, other arrangements are possible. Generally, the forces should be distributed along the extent of the connector portions. While it might be desirable to have a row of hooking elements above the connector portions and a row beneath them, this tends to be impractical for the following reasons. First, the normal construction of electronic devices of this type has the motherboard and its connectors at the bottom of the housing. It is therefore difficult to locate a latch below the connector. Second, such an arrangement would require either paired latch bars or a latch bar with a very large central opening to accommodate the motherboard, neither of which is especially desirable. Within this constraint, the arrangement shown, having one row proximate the connector and the other one spaced above to give a favorable moment for engagement, is highly satisfactory.

Accordingly, the above description and illustrations should not be construed as limiting the invention which is defined by the appended claims.

I claim:

1. In a system having first and second modules having cooperating pin and socket connector portions disposed along respective first and second walls, an improved latching mechanism for effecting engagement of said pin and socket connector portions while bringing respective external surfaces of said first and second walls into contact with one another comprising:
    a plurality of hooking members carried on said second wall and having respective camming surfaces in spaced facing relationship to said second external surface;
    portions of said first wall being formed with apertures corresponding to said hooking members and sized to accommodate said hooking members when said first and second external surfaces approach one another;
    a latch bar having camming portions corresponding to said hooking members;
    carriage means for mounting said latch bar to said first wall to allow movement of said latch bar between a first accommodating position wherein said latch bar does not obstruct said apertures in said first wall and a second capturing position wherein said camming portions cover at least portions of said apertures;
    said camming portions of said latch bar cooperating with said camming surfaces on said hooking members so that movement of said latch bar from said first position to said second position causes said first and second external surfaces to be drawn into contact with one another; and
    manually actuable means for effecting said movement of said latch bar, said means for effecting being operable at least when said hooking members enter said apertures.

2. The invention of claim 1 wherein said means for effecting comprises:
    a rotary latch pivotally mounted to said second wall for rotation about an axis perpendicular to said second wall;
    an eccentric pin on said rotary latch, said pin extending parallel to said axis and spaced apart therefrom;
    means defining a slot on said latch bar, said slot extending in a direction having a component perpendicular to the direction of said reciprocation; and
    means defining a curvilinear slot in said first wall to permit passage of said pin therethrough and permit rotation of said rotary latch over a given angular range.

3. The invention of claim 2 wherein said rotary latch carries a helical camming surface adjacent said pin and wherein said first wall is formed with a portion adjacent said curvilinear slot to engage said helical camming surface when said rotary latch is rotated in said disengaging sense to force separation of said first and second external surfaces.

4. The invention of claim 2 wherein said rotary latch carries a generally tangentially extending handle and wherein said handle is in a generally horizontal orientation when said latch bar is in said accommodating position and in a generally vertical downwardly directed orientation when said latch bar is in said capturing position.

5. The invention of claim 1 wherein said camming portions on said latch bar are wedge-shaped, and wherein said camming surfaces on said hooking members are substantially flat surfaces with respective contiguous flared portions.

6. The invention of claim 1, and further comprising means for biasing said latch bar toward said accommodating position.

7. In a system having first and second modules having cooperating pin and socket connector portions disposed along respective first and second walls, an improved latching mechanism for effecting engagement of said pin and socket connector portions while bringing respective external surfaces of said first and second walls into contact with one another comprising:
    a plurality of hooking members carried on said second wall and having respective camming surfaces in spaced facing relationship to said second external surface;
    an elongate shroud carried on said second wall and surrounding said second connector portion;
    a rotary latch pivotally mounted to said second wall for rotation about an axis perpendicular to said second external surface;
    portions of said first wall being formed with apertures corresponding to said hooking members and sized to accommodate said hooking members when said first and second external surfaces approach one another;
    portions of said first wall being formed with an elongate opening sized commensurately with said elongate shroud and surrounding said first connector portion;
    a latch bar having camming portions corresponding to said hooking members;
    carriage means for mounting said latch bar to said first wall to allow reciprocation of said latch bar between a first accommodating position wherein said latch bar does not obstruct said apertures in said first wall and a second capturing position wherein said camming portions cover at least portions of said apertures;

said camming portions of said latch bar cooperating with said camming surfaces on said hooking members so that movement of said latch bar from said first position to said second position causes said first and second external surfaces to be drawn into contact with one another and causes said first and second connector portions to engage one another; and means associated with said latch bar and said rotary latch for converting rotary motion of said rotary latch to reciprocal motion of said latch bar, said means for converting becoming operable when said hooking members enter said apertures, said means for converting defining opposite engaging and disengaging rotational senses for said rotary latch.

8. The invention of claim 7 wherein said means for converting comprises:

an eccentric pin on said rotary latch, said pin extending parallel to said axis and spaced apart therefrom;

means defining a slot on said latch bar, said slot extending in a direction having a component perpendicular to the direction of said reciprocation; and means defining a curvilinear slot in said first wall to permit passage of said pin therethrough and permit rotation of said rotary latch over a given angular range.

9. The invention of claim 8 wherein said rotary latch carries a helical camming surface adjacent said pin and wherein said first wall is formed with a portion adjacent said curvilinear slot to engage said helical camming surface when said rotary latch is rotated in said disengaging sense to force separation of said first and second external surfaces.

10. The invention of claim 7 wherein said rotary latch carries a generally tangentially extending handle and wherein said handle is in a generally horizontal orientation when said latch bar is in said accommodating position and in a generally vertical downwardly directed orientation when said latch bar is in said capturing position.

11. The invention of claim 7 wherein said camming portions on said latch bar are wedge-shaped, and wherein said camming surfaces on said hooking members are substantially flat surfaces with respective contiguous flared portions.

12. The invention of claim 7, and further comprising means for biasing said latch bar toward said accommodating position.

13. The invention of claim 7 wherein said hooking members are disposed in a first row proximate said shroud and a second row spaced apart therefrom.

14. A module for use in a computer system, said module having opposed first and second walls with complementary pin and socket connector portions disposed therealong, comprising:

a plurality of hooking members carried on an exterior surface of said second wall and having respective camming surfaces in spaced facing relationship to said exterior surface;

an elongate shroud carried on the exterior of said second wall and surrounding said second connector portion;

a rotary latch pivotally mounted to said second wall for rotation about an axis perpendicular to said second wall;

portions of said first wall being formed with apertures corresponding to said hooking members and sized to accommodate similarly spaced and configured hooking members on an additional module;

portions of said first wall being formed with an elongate opening sized commensurately with said elongate shroud and surrounding said first connector portion;

a latch bar having camming portions corresponding to said hooking members;

carriage means for mounting said latch bar to said first wall to allow reciprocation of said latch bar between a first accommodating position wherein said latch bar does not obstruct said apertures in said first wall and a second capturing position wherein said camming portions cover at least portions of said apertures;

said camming portions of said latch bar being operable to cooperate with camming surfaces on similarly configured hooking members passing through said apertures so that movement of said latch bar from said first position to said second position causes an additional module carrying said similarly configured hooking members to be drawn into contact with said first wall and causes a connector portion on said additional module configured like said second connector portion to engage said first connector portion; and means associated with said latch bar and said rotary latch for converting rotary motion of a similarly configured rotary latch to reciprocal motion of said latch bar, or for converting rotary motion of said rotary latch to reciprocal motion of a similarly configured latch bar, said means for converting defining opposite engaging and disengaging rotational senses for said rotary latch.

15. The invention of claim 14 wherein said means for converting comprises:

an eccentric pin on said rotary latch, said pin extending parallel to said axis and spaced apart therefrom;

means defining a slot on said latch bar, said slot extending in a direction having a component perpendicular to the direction of said reciprocation; and means defining a curvilinear slot in said first wall to permit passage of a similarly configured pin therethrough and permit rotation of a similarly configured rotary latch over a given angular range.

16. The invention of claim 15 wherein said rotary latch carries a helical camming surface adjacent said pin and wherein said first wall is formed with a portion adjacent said curvilinear slot to engage a similarly configured helical camming surface when a similarly configured rotary latch is rotated in said disengaging sense to force separation.

17. The invention of claim 14 wherein said rotary latch carries a generally tangentially extending handle and wherein said handle is in a generally horizontal orientation when said latch bar is in said accommodating position and in a generally vertical downwardly directed orientation when said latch bar is in said capturing position.

18. The invention of claim 14 wherein said camming portions on said latch bar are wedge-shaped, and wherein said camming surfaces on said hooking members are substantially flat surfaces with respective contiguous flared portions.

19. The invention of claim 14, and further comprising means for biasing said latch bar toward said accommodating position.

20. The invention of claim 14 wherein said hooking members are disposed in a first row proximate said shroud and a second row spaced apart therefrom.

21. A housing for a module in a computer system, said housing comprising:
opposed first and second walls;
a plurality of hooking members carried on an exterior surface of said second wall and having respective camming surfaces in spaced facing relationship to said exterior surface;
portions of said first wall formed with apertures corresponding to said hooking members and sized to accommodate similarly spaced and configured hooking members;
a latch bar having camming portions corresponding to said hooking members;
carriage means for mounting said latch bar to said first wall to allow movement of said latch bar between a first accommodating position wherein said latch bar does not obstruct said apertures in said first wall and a second capturing position wherein said camming portions cover at least portions of said apertures;
said camming portions of said latch bar cooperating with said camming surfaces on similarly configured hooking members passing through said apertures so that movement of said latch bar from said first position to said second position causes an additional module carrying said similarly configured hooking members to be drawn into contact with said first wall; and
manually actuable means for effecting said movement of said latch bar or of a similarly configured latch bar.

22. The invention of claim 21 wherein said means for effecting comprises:
a rotary latch pivotally mounted to said second wall for rotation about an axis perpendicular to said second wall;
an eccentric pin on said rotary latch, said pin extending parallel to said axis and spaced apart therefrom; and
means defining a slot on said latch bar, said slot extending in a direction having a component perpendicular to the direction of said reciprocation.

23. The invention of claim 22 wherein said rotary latch carries a helical camming surface adjacent said pin and wherein said first wall is formed with a portion adjacent said curvilinear slot to engage a similarly configured helical camming surface when similarly configured rotary latch is rotated in said disengaging sense to force separation.

24. The invention of claim 22 wherein said rotary latch carries a generally tangentially extending handle and wherein said handle is in a generally horizontal orientation when said latch bar is in said accommodating position and in a generally vertical downwardly directed orientation when said latch bar is in said capturing position.

25. The invention of claim 21 wherein said camming portions on said latch bar are wedge-shaped, and wherein said camming surfaces on said hooking members are substantially flat surfaces with respective contiguous flared portions.

26. The invention of claim 21, and further comprising means for biasing said latch bar toward said first accommodating position.

* * * * *

UNITED STATES PATENT AND TRADEMARK OFFICE
CERTIFICATE OF CORRECTION

PATENT NO. : 4,501,460                    Page 1 of 2
DATED      : February 26, 1985
INVENTOR(S): John R. Sisler It is certified that error appears in the above-identified patent and that said Letters Patent is hereby corrected as shown below:

Column 5, line 39, delete "pin and socket".

Column 5, line 42, delete "pin and socket".

Column 6, line 1, change "effecting" to --causing--.

Column 6, line 6, change "effecting" to --causing--.

Column 6, lines 23 and 24, delete "in said disengaging sense" and insert --so as-- in its place.

Column 6, line 42, before "cooperating" insert --respective first and second--.

Column 6, line 45, delete "pin and socket".

Column 7, line 59, before "complementary" insert --respective first and second--.

Column 7, line 60, delete "pin and socket".

Column 10, line 1, change "effecting" to --causing--.

Column 10, line 20, delete "disengaging sense" and insert --so as-- in its place.

UNITED STATES PATENT AND TRADEMARK OFFICE
CERTIFICATE OF CORRECTION

PATENT NO. : 4,501,460  
DATED : February 26, 1985  
INVENTOR(S) : John R. Sisler Page 2 of 2

It is certified that error appears in the above-identified patent and that said Letters Patent is hereby corrected as shown below:

Column 6, line 2, "effecting" should read --causing--.

Column 6, line 42, delete "pin and socket".

Column 10, line 5, "effecting" should read --causing--.

Signed and Sealed this

Twenty-first Day of April, 1987

Attest:

DONALD J. QUIGG

*Attesting Officer*  *Commissioner of Patents and Trademarks*